(12) United States Patent
Kwak

(10) Patent No.: US 11,963,350 B2
(45) Date of Patent: Apr. 16, 2024

(54) SEMICONDUCTOR MEMORY DEVICE AND METHOD FOR FABRICATING THE SAME

(71) Applicant: SK hynix Inc., Icheon-si (KR)

(72) Inventor: Sang Hyon Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 318 days.

(21) Appl. No.: 17/218,850

(22) Filed: Mar. 31, 2021

(65) Prior Publication Data

US 2022/0223617 A1 Jul. 14, 2022

(30) Foreign Application Priority Data

Jan. 8, 2021 (KR) .................. 10-2021-0002554

(51) Int. Cl.
*H10B 43/27* (2023.01)
*H10B 41/10* (2023.01)
*H10B 41/27* (2023.01)
*H10B 41/40* (2023.01)
*H10B 43/10* (2023.01)
*H10B 43/40* (2023.01)

(52) U.S. Cl.
CPC ............ *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ........ H10B 20/00–10; H10B 20/27–50; H10B 41/00–70; H10B 43/00–50; H10B 53/20; H10B 69/00; H01L 29/401; H01L 29/42356; H01L 29/66833; H01L 23/5226; H01L 27/1024; H01L 27/2463; H01L 27/2481; H01L 29/4234–42352; H01L 29/42324–42336; H01L 29/788–7889; H01L 29/792–7926; H01L 2924/145; H01L 2924/1451; H01L 2924/1453; H01L 2924/14511; G11C 11/5621–5642; G11C 16/02; G11C 16/0466–0475; G11C 16/0408–0458; G11C 16/0483; G11C 2216/06–10; G11C 2216/12–30; G11C 27/005
See application file for complete search history.

(56) References Cited

U.S. PATENT DOCUMENTS

| | | | | |
|---|---|---|---|---|
| 2016/0141301 A1* | 5/2016 | Mokhlesi | ............... | G11C 16/08 |
| | | | | 365/185.23 |
| 2018/0366488 A1* | 12/2018 | Choi | ...................... | H10B 43/27 |
| 2020/0312867 A1* | 10/2020 | Xiao | ...................... | H10B 43/27 |
| 2022/0108994 A1* | 4/2022 | Lee | ..................... | H01L 23/5226 |

FOREIGN PATENT DOCUMENTS

| | | | |
|---|---|---|---|
| KR | 1020100111165 A | | 10/2010 |
| KR | 1020140127577 A | | 11/2014 |

\* cited by examiner

*Primary Examiner* — David Vu
(74) *Attorney, Agent, or Firm* — WILLIAM PARK & ASSOCIATES LTD.

(57) ABSTRACT

A semiconductor memory device and a method for fabricating the same are provided. The semiconductor memory device includes a plurality of gate stacks separated by a plurality of slit structures, and each of the gate stacks includes: a first stack including three or more first conductive patterns spaced apart from one another at substantially a same level; a second stack formed on the first stack and including second conductive patterns and interlayer dielectric layers alternately stacked; and a plurality of channel structures penetrating the second stack and the first stack.

11 Claims, 13 Drawing Sheets

SEMICONDUCTOR MEMORY DEVICE AND METHOD FOR FABRICATING THE SAME

CROSS-REFERENCES TO RELATED APPLICATION

The present application claims priority under 35 U.S.C. § 119(a) to Korean application number 10-2021-0002554, filed on Jan. 8, 2021, in the Korean Intellectual Property Office, which is incorporated herein by reference in its entirety.

BACKGROUND

1. Technical Field

The present disclosure generally relates to an electronic device, and more particularly, to a semiconductor memory device and a method for fabricating the same.

2. Related Art

In order to satisfy superior performance and low cost required for consumers, it is necessary to improve the degree of integration of semiconductor memory devices. Particularly, in the semiconductor memory devices, the degree of integration is an important factor for determining product performance and cost. Thus, various efforts for improving the degree of integration have been continued. For example, in a semiconductor memory device including a plurality of memory cells, research has been actively conducted on a three-dimensional semiconductor memory device, capable of reducing a dimension occupied by the memory cells per unit area by arranging the memory cells three-dimensionally.

SUMMARY

The present disclosure is directed to providing a semiconductor memory device capable of improving operational reliability and a method for fabricating the same.

A semiconductor memory device in accordance with an embodiment of the present disclosure may include: a plurality of gate stacks separated by a plurality of slit structures, wherein each of the gate stacks may include: a first stack including three or more first conductive patterns spaced apart from one another at substantially a same level; a second stack formed on the first stack and including second conductive patterns and interlayer dielectric layers alternately stacked; a third stack formed on the second stack and including a plurality of third conductive patterns spaced apart from one another at substantially another same level; and a plurality of channel structures penetrating the first stack to the third stack.

A semiconductor memory device in accordance with an embodiment of the present disclosure may include: a plurality of gate stacks separated by a plurality of slit structures, wherein each of the gate stacks may include: a first stack having a multilayer structure and including three or more first conductive patterns spaced apart from one another for each layer; a second stack formed on the first stack and including second conductive patterns and interlayer dielectric layers alternately stacked; a third stack formed on the second stack, having a single layer structure, and including a plurality of third conductive patterns spaced apart from one another; and a plurality of channel structures penetrating the first stack to the third stack. The first conductive patterns may include: three or more first patterns located on a lower layer; second patterns located on an upper layer and located on both edges of the first stack; and a plurality of third patterns located on the upper layer and located between the second patterns.

A method for fabricating a semiconductor memory device in accordance with an embodiment of the present disclosure may include steps of: forming a first stack including at least three or more first conductive patterns spaced apart from one another at substantially a same level; forming a stack layer including interlayer dielectric layers and sacrificial layers alternately stacked on the first stack; forming a plurality of channel structures penetrating the stack layer and the first stack; forming slit trenches in both sidewalls of the stack layer and the first stack; removing the sacrificial layers through the slit trenches; and forming a second stack including second conductive patterns and interlayer dielectric layers alternately stacked by gap-filling, with a conductive material, a space from which the sacrificial layers have been removed.

In the present disclosure based on the solution to the aforementioned problem, each of a plurality of memory blocks includes at least three or more first conductive patterns serving as source selection lines at substantially a same level, thereby substantially preventing an increase in read disturb due to an increase in the degree of integration of a semiconductor memory device. Consequently, it is possible to improve the operational reliability of the semiconductor memory device.

Furthermore, in addition to reducing read disturb, a first stack including at least three or more first conductive patterns is formed before a second stack, a slit structure, and a channel structure are formed, so that it is possible to improve the operational reliability of the semiconductor memory device, and simultaneously, to substantially prevent an increase in process steps, thereby securing price competitiveness.

DETAILED DESCRIPTION

Figure 1:
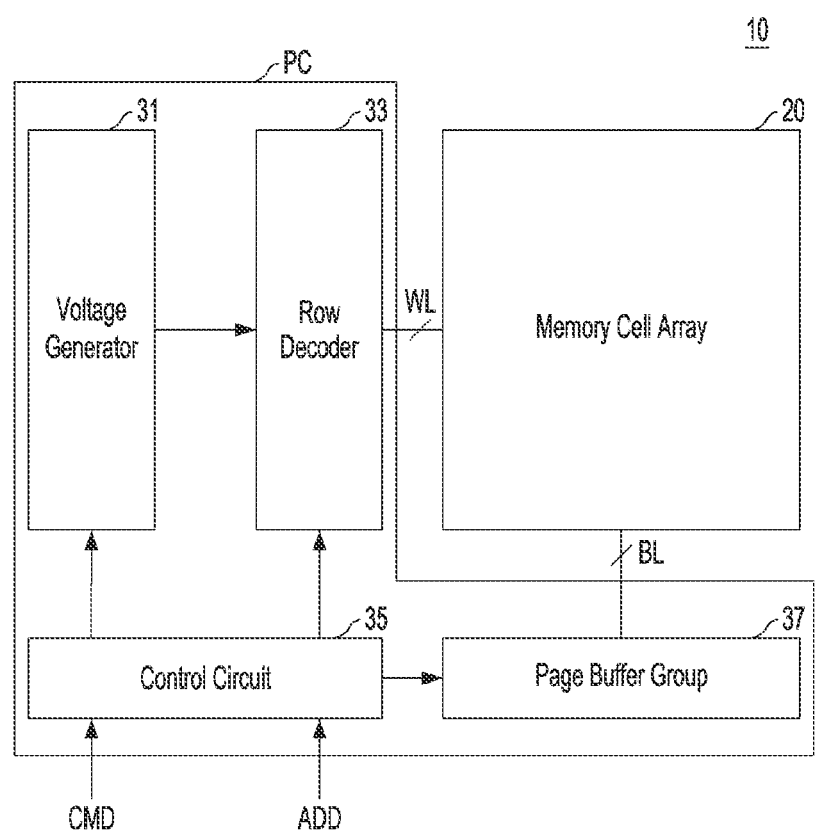
FIG. 1 is a block diagram illustrating a semiconductor memory device in accordance with an embodiment of the present disclosure.

Hereinafter, the advantages and features of the present disclosure and methods for achieving them will become apparent with reference to the following detailed description in conjunction with the accompanying drawings. However, the present disclosure is not limited to such embodiments and the present disclosure may be realized in various forms. The embodiments to be described below are nothing but the ones provided to bring the disclosure of the present technology to perfection and assist those skilled in the art to completely understand the scope of the present disclosure in the technical field to which the present disclosure pertains. The present disclosure is defined only by the scope of the appended claims. In the drawings, the sizes and relative sizes of layers and regions may be exaggerated for clarity of description. The same reference numerals refer to the same component throughout the specification.

An embodiment of the present disclosure to be described below may provide a semiconductor memory device capable of improving operational reliability and a method for fabricating the same. More specifically, an embodiment of the present disclosure may provide a semiconductor memory device including source selection lines, which are separated by substantially the same level as drain selection lines or higher, in order to improve read disturb due to an increase in the number of cell strings integrated in one memory block in a nonvolatile semiconductor memory device having a three-dimensional structure, for example, a three-dimensional (3D) NAND, and a method for fabricating the same. Thus, the structure of the present disclosure reduces read disturb to improve performance and reduces usage of area by its three-dimensional structure, providing a highly useful, well-designed product.

For reference, since the semiconductor memory device, for example, the NAND, operates in units of blocks, a block density increases as the degree of integration of the semiconductor memory device increases. When the block density increases, read disturb may inevitably increase. In such a case, when the source selection lines are not separated within the block, the read disturb increases several times or more times as the increase in the degree of integration, which makes it very difficult to secure a required performance. That is, it is very difficult to secure operational reliability.

While seeking to improve one chip quality, another chip quality may be reduced. For example, when a method for increasing the number of cell strings integrated in one memory block having a limited dimension is used to increase the degree of integration of the semiconductor memory device, process steps may inevitably increase in order to separate the source selection lines due to the restrictions on a dimension occupied by the source selection lines and a process order. Thus, it is difficult to secure price competitiveness.

Therefore, in order to substantially prevent an increase in read disturb due to the improvement in the degree of integration of the semiconductor memory device, there is a need for a method capable of securing operational reliability, and simultaneously, securing price competitiveness by separating the source selection lines by substantially the same level as the drain selection lines or higher.

Hereinafter, a semiconductor memory device in accordance with an embodiment of the present disclosure will be described in detail with reference to the drawings. In the following description, a first direction D1, a second direction D2, and a third direction D3 may refer to directions that intersect one another. For example, in an XYZ coordinate system, the first direction D1, the second direction D2, and the third direction D3 may be an X-axis direction, a Y-axis direction, and a Z-axis direction, respectively.

FIG. 1 is a block diagram illustrating a semiconductor memory device 10 in accordance with an embodiment of the present disclosure.

As illustrated in FIG. 1, the semiconductor memory device 10 in accordance with the present embodiment may include a peripheral circuit PC and a memory cell array 20.

The peripheral circuit PC may be configured to control a program operation for storing data in the memory cell array 20, a read operation for outputting the data stored in the memory cell array 20, and an erase operation for erasing the data stored in the memory cell array 20, wherein, for example, the peripheral circuit PC may include a voltage generator 31, a row decoder 33, a control circuit 35, and a page buffer group 37.

The memory cell array 20 may include a plurality of memory blocks. The memory cell array 20 may be electrically connected to the row decoder 33 through word lines WL, and may be electrically connected to the page buffer group 37 through bit lines BL.

In response to a command CMD and an address ADD, the control circuit 35 may control the peripheral circuit PC.

The voltage generator 31 may generate various operation voltages, such as a pre-erase voltage, an erase voltage, a ground voltage, a program voltage, a verification voltage, a pass voltage, and a read voltage used for the program operation, the read operation, and the erase operation, in response to the control of the control circuit 35.

The row decoder 33 may select a memory block of the memory cell array 20 in response to the control of the control circuit 35. The row decoder 33 may be configured to apply operating voltages to word lines WL electrically connected to the selected memory block.

As illustrated in FIG. 1, page buffer group 37 may be electrically connected to the memory cell array 20 through the bit lines BL. In response to the control of the control circuit 35, the page buffer group 37 may temporarily store data received from an input/output circuit (not illustrated) during a program operation. The page buffer group 37 may sense voltages or currents of the bit lines BL during a read operation or a verification operation in response to the control of the control circuit 35. The page buffer group 37 may select the bit lines BL in response to the control of the control circuit 35.

Structurally, the memory cell array 20 may be disposed in parallel to the peripheral circuit PC or may overlap a part of the peripheral circuit PC.

Figure 2:
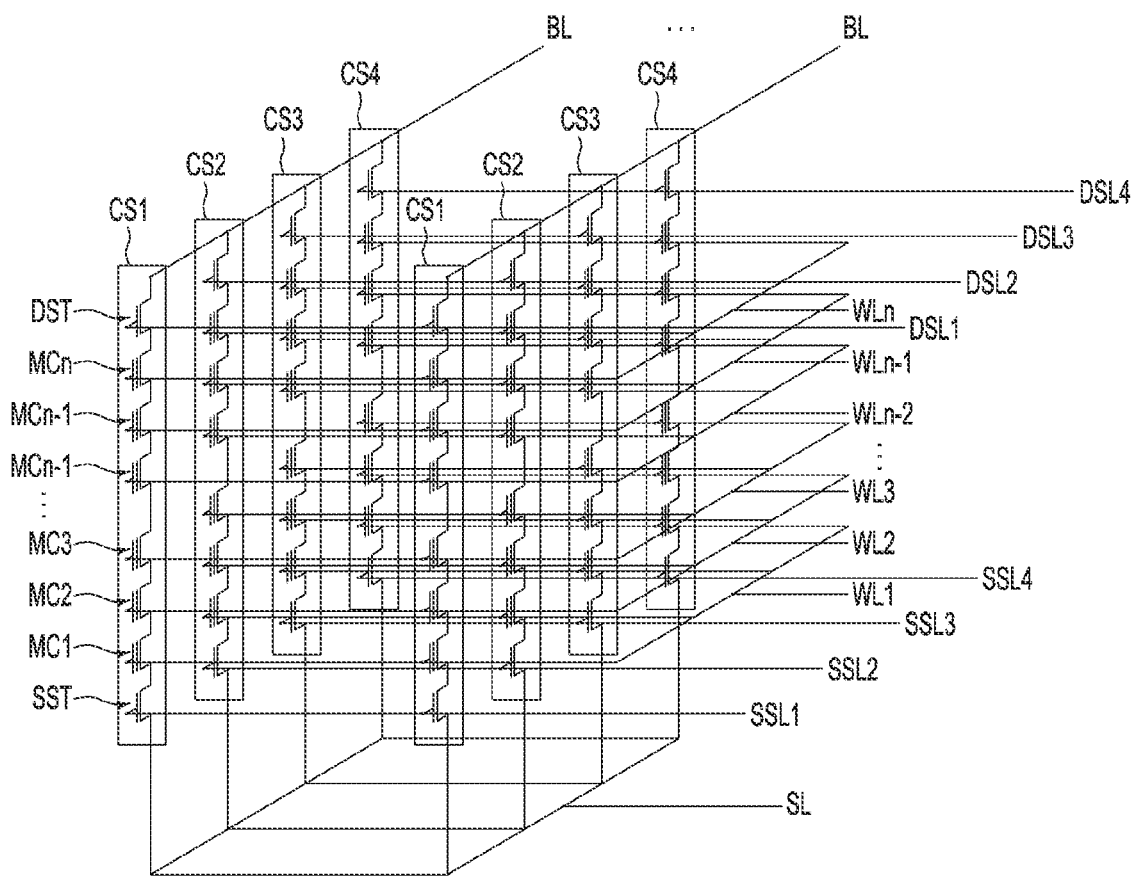
FIG. 2 is a circuit diagram illustrating a memory block of the semiconductor memory device in accordance with an embodiment of the present disclosure.

FIG. 2 is a circuit diagram illustrating the memory block of the semiconductor memory device in accordance with an embodiment of the present disclosure.

As illustrated in FIG. 2, the memory block may include a source layer SL and a plurality of cell strings CS1 to CS4 electrically connected in common to a plurality of word lines WL1 to WLn (where n is a positive integer). The plurality of cell strings CS1 to CS4 may be electrically connected to a plurality of bit lines BL.

As shown in FIG. 2, each of the plurality of cell strings CS1 to CS4 may include at least one or more source selection transistors SST electrically connected to the source layer SL, at least one or more drain selection transistors DST electrically connected to the bit lines BL, and a plurality of memory cells MC1, to MCn electrically connected in series between the source selection transistor SST and the drain selection transistor DST.

Gates of the plurality of memory cells MC1, to MCn may be electrically connected to the plurality of word lines WL1 to WLn stacked spaced apart from one another, respectively. The plurality of word lines WL1 to WLn may be disposed between three or more source selection lines SSL1 to SSL4 and three or more drain selection lines DSL1 to DSL4. The three or more source selection lines SSL1 to SSL4 may be spaced apart from one another at substantially a same level. Likewise, the three or more drain selection lines DSL1 to DSL4 may be spaced apart from one another at substantially a same level.

A gate of the source selection transistor SST may be electrically connected to a corresponding source selection line. A gate of the drain selection transistor DST may be electrically connected to a drain selection line corresponding to the gate of the drain selection transistor DST.

The source layer SL may be electrically connected to a source of the source selection transistor SST. A drain of the drain selection transistor DST may be electrically connected to a bit line corresponding to the drain of the drain selection transistor DST.

The plurality of cell strings CS1 to CS4 may be divided into string groups electrically connected to the three or more source selection lines SSL1 to SSL4 and the three or more drain selection lines DSL1 to DSL4 so that strings electrically connected to substantially the same word lines and substantially the same bit lines may be independently controlled by different source selection lines and drain selection lines. Furthermore, cell strings electrically connected to substantially the same source selection lines and substantially the same drain selection lines may be independently controlled by different bit lines. For example, the three or more source selection lines SSL1 to SSL4 may include a first source selection line SSL1 to a fourth source selection line SSL4, and the three or more drain selection lines DSL1 to DSL4 may include a first drain selection line DSL1 to a fourth drain selection line DSL4. The plurality of cell strings CS1 to CS4 may include a first cell string CS1 of a first string group electrically connected to the first source selection line SSL1 and the first drain selection line DSL1, a second cell string CS2 of a second string group electrically connected to the second source selection line SSL2 and the second drain selection line DSL2, a third cell string CS3 of a third string group electrically connected to the third source selection line SSL3 and the third drain selection line DSL3, and a fourth cell string CS4 of a fourth string group electrically connected to the fourth source selection line SSL4 and the fourth drain selection line DSL4.

Figure 3:
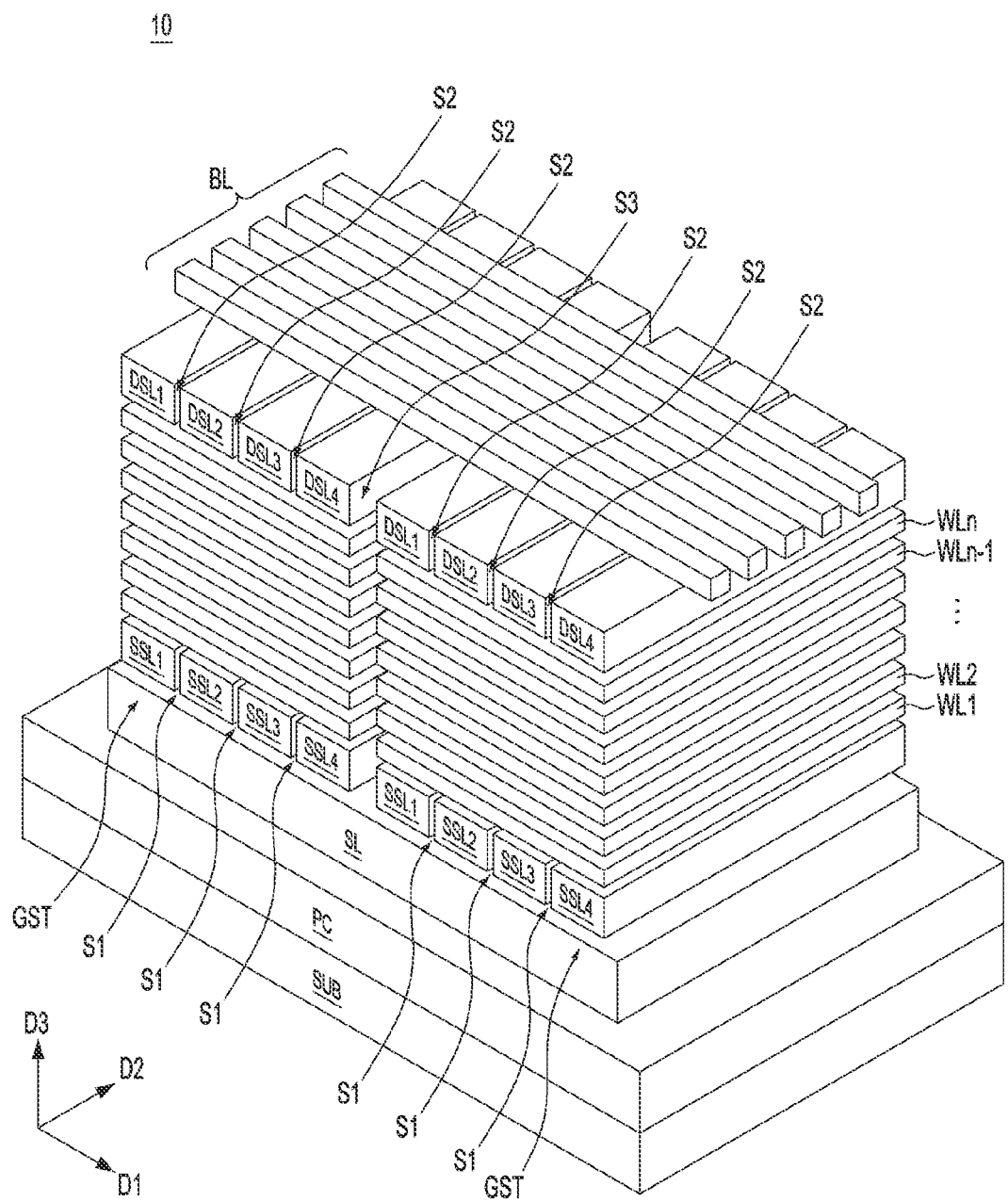
FIG. 3 is a perspective view schematically illustrating the semiconductor memory device in accordance with an embodiment of the present disclosure.

FIG. 3 is a perspective view schematically illustrating the semiconductor memory device in accordance with an embodiment of the present disclosure.

As illustrated in FIG. 3, the semiconductor memory device 10 may include the peripheral circuit PC disposed on a substrate SUB and gate stacks GST overlapping the peripheral circuit PC.

Each of the gate stacks GST may include the three or more source selection lines SSL1 to SSL4 separated from one another at substantially a same level by a first slit S1, the plurality of word lines WL1 to WLn, and the three or more drain selection lines DSL1 to DSL4 separated from one another at substantially a same level by a second slit S2. For reference, the present embodiment illustrates a case wherein each of the gate stacks GST includes four source selection lines SSL1 to SSL4 and four drain selection lines DSL1 to DSL4.

The three or more source selection lines SSL1 to SSL4, the plurality of word lines WL1 to WLn, and the three or more drain selection lines DSL1 to DSL4 may extend in the first direction D1 and the second direction D2, and may be formed in a flat plate shape in parallel to the upper surface of the substrate SUB.

As illustrated in FIG. 3, the plurality of word lines WL1 to WLn may be stacked spaced apart from one another in the third direction D3. The plurality of word lines WL1 to WLn may be disposed between the three or more drain selection lines DSL1 to DSL4 and the three or more source selection lines SSL1 to SSL4.

The gate stacks GST may be separated from one another by a third slit S3. The first slit S1 and the second slit S2 may be formed to be shorter than the third slit S3 in the third direction D3 as is shown in FIG. 3, and may overlap the plurality of word lines WL1 to WLn.

Each of the first slit S1 to the third slit S3 may extend in a straight line shape, a zigzag shape (not shown), or a wave shape (not shown). The width of each of the first slit S1 to the third slit S3 may be variously changed according to a design rule.

The three or more source selection lines SSL1 to SSL4 may be disposed closer to the peripheral circuit PC than the three or more drain selection lines DSL1 to DSL4. The semiconductor memory device 10 may include the source layer SL disposed between the gate stacks GST and the peripheral circuit PC, and the plurality of bit lines BL spaced farther from the peripheral circuit PC than the source layer SL. The gate stacks GST may be disposed between the plurality of bit lines BL and the source layer SL.

The plurality of bit lines BL may be formed of various conductive materials, such as, for example, a doped semiconductor layer, a metal layer, a metal alloy layer, and the like. The source layer SL may include a doped semiconductor layer such as, for example, an n-type doped silicon layer.

Although not illustrated in the drawing, the peripheral circuit PC may be electrically connected to the plurality of bit lines BL, the source layer SL, and the plurality of word lines WL1 to WLn through interconnections having various structures.

Figure 4:
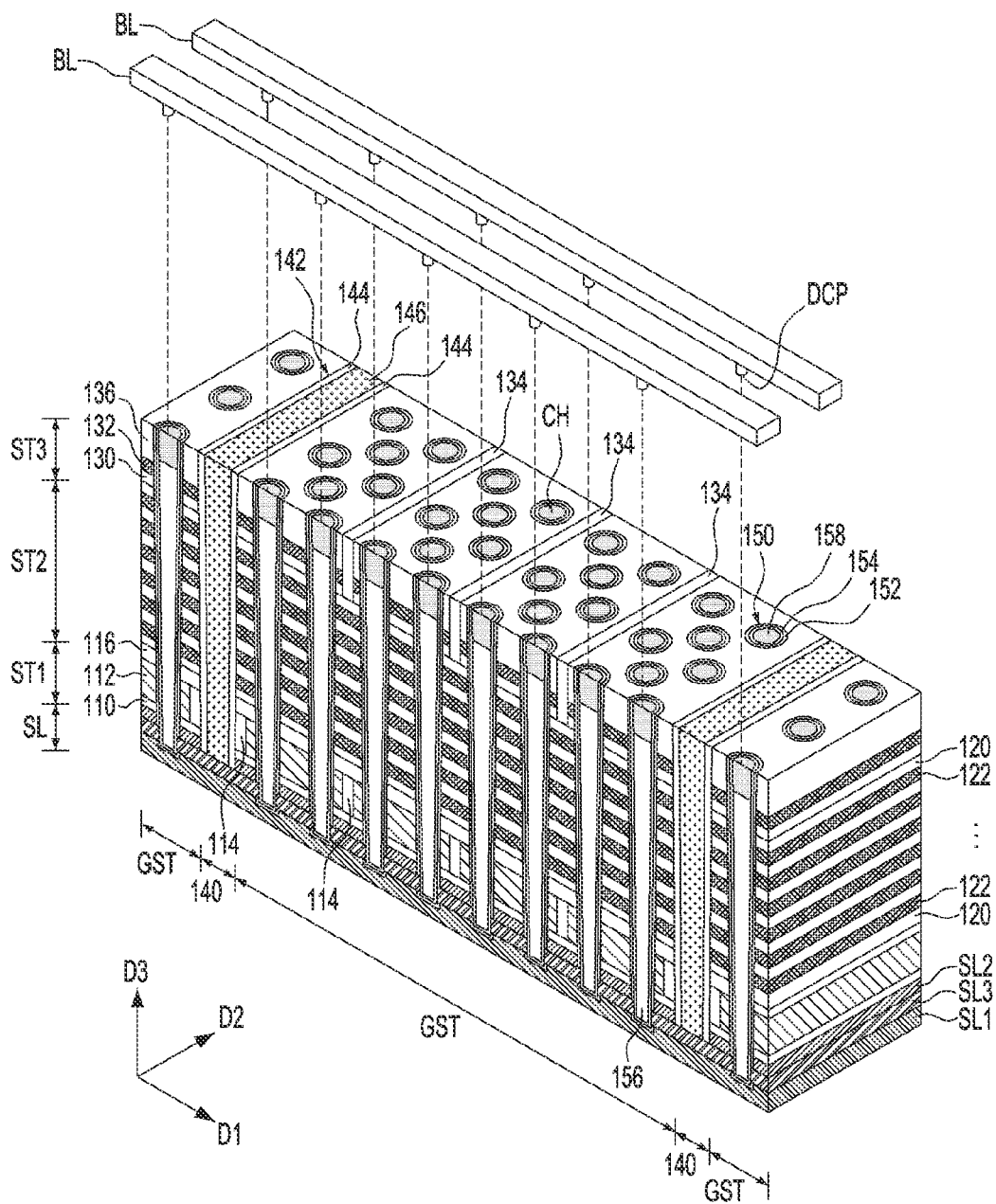
FIG. 4 is a perspective view illustrating the semiconductor memory device in accordance with an embodiment of the present disclosure.

FIG. 4 is a perspective view illustrating the semiconductor memory device in accordance with an embodiment of the present disclosure.

As illustrated in FIG. 4, each of the gate stacks GST may be separated by a plurality of slit structures 140 and may include a first stack ST1, a second stack ST2, and a third stack ST3 sequentially stacked. Each of the gate stacks GST may be separated by the slit structures 140 and may correspond to the memory block. The source layer SL may be located below the gate stacks GST and the plurality of bit lines BL may be located above the gate stacks GST. The source layer SL, the gate stacks GST, and the bit lines BL may overlap one another.

Meanwhile, the present embodiment illustrates a case where the source layer SL and the bit lines BL are located below and above the gate stacks GST, respectively; however, the present disclosure is not limited thereto. As a modified example, the bit lines BL and the source layer SL may be located below and above the gate stacks GST, respectively.

Figure 7:
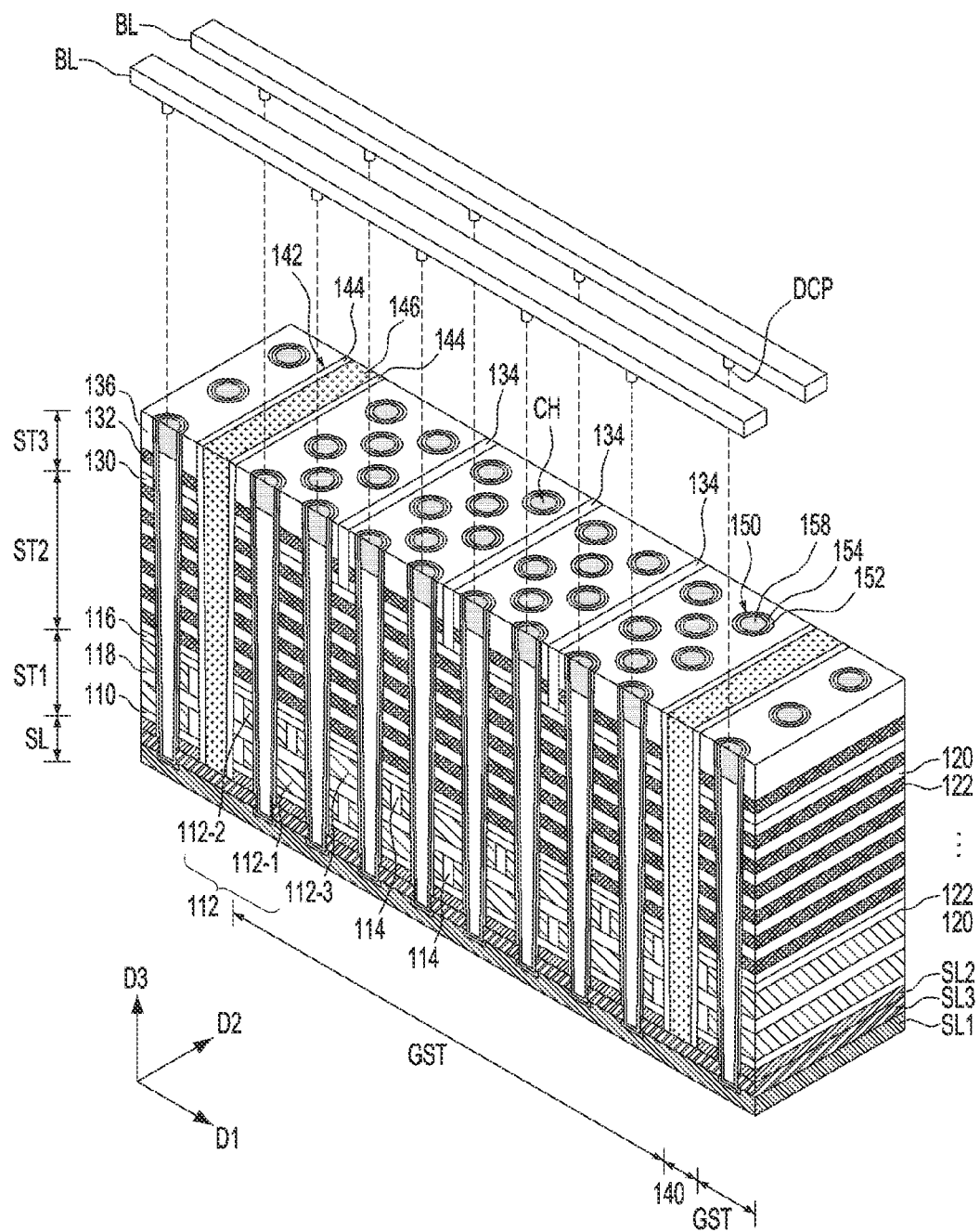

The source layer SL may overlap the gate stacks GST and have a flat plate shape extending in the first direction D1 and the second direction D2. The source layer SL may have a structure in which a first source layer SL1, a second source layer SL2, and a third source layer SL3 are stacked, as shown in FIG. 7. Here, the source layer SL may have a structure in which the third source layer SL3 is interposed between the first source layer SL1 and the second source layer SL2. The third source layer SL3 may be electrically connected to a channel layer 154 by penetrating a memory layer 152 of each of channel structures CH.

Each of the first source layer SL1 to the third source layer SL3 may include a doped semiconductor layer such as, for example, each of the first source layer SL1 to the third source layer SL3 may include an N-type doped silicon layer. In such a case, the impurity doping concentration of the third source layer SL3 interposed between the first source layer SL1 and the second source layer SL2 may be larger than those of the first source layer SL1 and the second source layer SL2.

Meanwhile, the present embodiment illustrates a case where the first source layer SL1 to the third source layer SL3 are all formed of substantially the same conductive material; however, the present disclosure is not limited thereto. As a modified example, the first source layer SL1 and the second source layer SL2 may include substantially a same conductive material and the third source layer SL3 interposed therebetween may include a conductive material different from those of the first source layer SL1 and the second source layer SL2.

The slit structure 140 that separates the gate stacks GST from each other may correspond to the third slit S3 illustrated in FIG. 3. Each of the slit structures 140 may be a line-type pattern extending in the second direction D2, wherein the slit structures 140 may be located on both sidewalls of the gate stack GST in the first direction D1. An end of the slit structure 140 in the third direction D3 may have a shape extending into the source layer SL. For example, the bottom surface of the slit structure 140 may come into contact with the third source layer SL3 interposed between the first source layer SL1 and the second source layer SL2.

As shown in FIG. 7, each of the slit structures 140 may include a line-type slit trench 142 extending in the second direction D2, a slit spacer 144 formed on either side of the slit trench 142, and a slit layer 146 for gap-filling the slit trench 142. The slit spacer 144 may include an insulating material and the slit layer 146 may include a conductive material.

Meanwhile, the present embodiment illustrates a case where the slit layer 146 includes a conductive material; however, the present disclosure is not limited thereto. As a modified example, the slit layer 146 may include an insulating material.

In each of the gate stacks GST, the first stack ST1 may provide a plurality of source selection transistors and at least three or more source selection lines. To this end, the first stack ST1 may include a first lower insulating layer 110 formed on the source layer SL, at least three or more first conductive patterns 112 formed on the first lower insulating layer 110 and spaced apart from one another at substantially a same level, a gap-fill insulating layer 114 for gap-filling between the first conductive patterns 112, and a first upper insulating layer 116 formed on the first conductive patterns 112 and the gap-fill insulating layer 114.

The first lower insulating layer 110 may play a role of electrically isolating the source layer SL from the first conductive patterns 112. The gap-fill insulating layer 114 may correspond to the first slit S1 illustrated in FIG. 3 and may play a role of electrically isolating the first conductive patterns 112 from each other. The first upper insulating layer 116 may play a role of electrically isolating the second stack ST2 from the first conductive patterns 112. The gap-fill insulating layer 114 and the first upper insulating layer 116 may be formed through a one-time insulating layer deposition process, which is a cost-saving process. That is, the gap-fill insulating layer 114 and the first upper insulating layer 116 may be integrally formed with each other. The first lower insulating layer 110, the gap-fill insulating layer 114, and the first upper insulating layer 116 may each include an oxide layer. Meanwhile, when an interlayer dielectric layer 120 is disposed on the lowermost layer of the second stack ST2, the first upper insulating layer 116 may be omitted from the first stack ST1.

Each of the first conductive patterns 112 may serve as the gate of the source selection transistor and the source selection line so that the first conductive patterns 112 may correspond to the plurality of source selection lines SSL1 to SSL4 in FIG. 3 Each of the first conductive patterns 112 may include a doped semiconductor layer or a metal silicide layer, and each of the first conductive patterns 112 may also include a stacked layer in which the doped semiconductor layer and the metal silicide layer are stacked. For example, the doped semiconductor layer may include an n-type doped silicon layer and the metal silicide layer may include a tungsten silicide layer. The use of the doped semiconductor layer and/or the metal silicide layer, instead of a metal layer having a low specific resistance, as the first conductive pattern 112 is to substantially prevent deterioration in the first conductive patterns 112 due to an external force applied to the first conductive patterns 112 between processes, particularly, high temperature. For reference, the doped semiconductor layer and the metal silicide layer have higher thermal resistance to high temperature than the metal layer, making it advantageous to use the doped semiconductor layer and the metal silicide layer instead of the metal layer.

The first conductive patterns 112 may be disposed spaced apart from one another in the first direction D1 at substantially a same level, and may each have a flat plate shape extending in the first direction D1 and the second direction D2. In the first direction D1, one sidewall or both sidewalls of each of the first conductive patterns 112 may have a straight line shape, a zigzag shape, or a wave shape, and the sidewall of the first conductive pattern 112 located at an edge of the first stack ST1 may be spaced apart from a sidewall of a facing slit structure 140. That is, the gap-fill insulating layer 114 may also gap-fill between the slit structure 140 and the first conductive pattern 112, which may be due to a fabricating method for forming at least three or more source selection lines at substantially a same level in one memory block, which will be described below. For example, by a fabricating method for forming the first stack including the first conductive patterns before forming the second stack ST2, the third stack ST3, the slit structures 140, and the channel structures CH, the sidewall of the first conductive pattern 112 located at the edge of the first stack ST1 may be spaced apart from a sidewall of a facing slit structure 140. For reference, typically, the source selection line may be formed using a method for replacing a sacrificial layer with a conductive layer during a process of forming the slit structure 140. However, in the method for replacing the sacrificial layer with the conductive layer, three or more first conductive patterns 112 may not be physically formed in the first stack ST1. Therefore, it should be noted that there is a limit in substantially preventing an increase in read disturb due to an increase in the degree of integration of the semiconductor memory device.

In each of the gate stacks GST, the second stack ST2 may provide respective gates of a plurality of memory cells and a plurality of word lines. To this end, the second stack ST2 may have a structure in which interlayer dielectric layers 120 and second conductive patterns 122 are alternately stacked in the third direction D3. The interlayer dielectric layer 120 may be located on each of the lowermost layer and the uppermost layer of the second stack ST2. The interlayer dielectric layer 120 may include an oxide layer.

Meanwhile, the present embodiment illustrates a case where the interlayer dielectric layer 120 is located on each of the lowermost layer and the uppermost layer of the second stack ST2; however, the present disclosure is not limited thereto. As a modified example, the second conductive pattern 122 may be located on each of the lowermost layer and/or the uppermost layer of the second stack ST2.

In the second stack ST2, each of the second conductive patterns 122 may serve as the gate of the memory cell and the word line, so that the second conductive patterns 122 may correspond to the plurality of word lines WL1 to WLn in FIG. 3. Each of the second conductive patterns 122 may overlap the at least three or more first conductive patterns 112, and have a flat plate shape extending in the first direction D1 and the second direction D2. In the first direction D1, one sidewall or both sidewalls of each of the second conductive patterns 122 may have a straight line shape, a zigzag shape, or a wave shape, and the sidewall of each of the second conductive patterns 122 may come into contact with a sidewall of a facing slit structure 140 because the second conductive patterns 122 are formed using the method for replacing the sacrificial layer with the conductive layer during the process of forming the slit structure 140. Each of the second conductive patterns 122 may include a metal layer, wherein each of the second conductive patterns 122 may include a tungsten layer.

In each of the gate stacks GST, the third stack ST3 may provide a plurality of drain selection transistors and at least three or more drain selection lines. To this end, the third stack ST3 may include a second lower insulating layer 130 formed on the second stack ST2, at least three or more third conductive patterns 132 formed on the second lower insulating layer 130 and spaced apart from one another at substantially the same level, a second upper insulating layer 136 that covers the third conductive patterns 132, and a separation layer 134 that separates the third conductive patterns 132 from each other by penetrating the second upper insulating layer 136. The third conductive patterns 132 may correspond to the first conductive patterns 112, respectively, and may overlap one another. Furthermore, each of the second conductive patterns 122 may overlap the at least three or more third conductive patterns 132.

The second lower insulating layer 130 may play a role of electrically isolating the second conductive pattern 122 formed on the uppermost layer of the second stack ST2 from the third conductive patterns 132. The second upper insulating layer 136 may play a role of electrically isolating structures formed on the third stack ST3 from each other, for example, isolating the bit lines BL from the third conductive patterns 132, and may have a larger thickness than that of the second lower insulating layer 130 or the interlayer dielectric layer 120. This may provide a space where a capping layer 158 is to be formed in the channel structure CH. The separation layer 134 may play a role of electrically isolating the third conductive patterns 132 from each other, so that the separation layer 134 may correspond to the second slit S2 in FIG. 3. An end of the separation layer 134 may extend into the second lower insulating layer 130. The second lower insulating layer 130, the separation layer 134, and the second upper insulating layer 136 may each include an oxide layer. Meanwhile, when the interlayer dielectric layer 120 is disposed on the uppermost layer of the second stack ST2, the second lower insulating layer 130 may be omitted from the third stack ST3.

Each of the third conductive patterns 132 may serve as the gate of the drain selection transistor and the drain selection line, so that the third conductive patterns 132 may correspond to the plurality of drain selection lines DSL1 to DSL4 in FIG. 3. The third conductive patterns 132 may be disposed spaced apart from one another in the first direction D1 at substantially a same level, and may each have a flat plate shape extending in the first direction D1 and the second direction D2. In the first direction D1, one sidewall or both sidewalls of each of the third conductive patterns 132 may have a straight line shape, a zigzag shape, or a wave shape, and the sidewall of the third conductive pattern 132 located at an edge of the third stack ST3 may come into contact with or may be spaced apart from a sidewall of a facing slit structure 140. For reference, when the third conductive patterns 132 are formed using the method for replacing the sacrificial layer with the conductive layer during the process of forming the slit structure 140, the sidewall of the third conductive pattern 132 may come into contact with a sidewall of a facing slit structure 140. On the other hand, when the third conductive pattern 132 is formed using substantially the same method as that for forming the first conductive pattern 112, the sidewall of the third conductive pattern 132 may be spaced apart from a sidewall of a facing slit structure 140. Each of the third conductive patterns 132 may include a metal layer, such as, for example, a tungsten layer.

Meanwhile, the present embodiment illustrates a case where the third conductive pattern 132 is formed as a single layer; however, the present disclosure is not limited thereto. As a modified example, two or more layers of the third conductive patterns 132 may be stacked in the third direction D3.

The first stack ST1, the second stack ST2, and the third stack ST3 of each of the gate stacks GST may be penetrated by a plurality of channel structures CH. In the first stack ST1, the channel structures CH may penetrate the first conductive patterns 112, and the number of the channel structures CH penetrating the respective first conductive patterns 112 may be substantially the same. Likewise, in the third stack ST3, the channel structures CH may penetrate the third conductive patterns 132, and the number of the channel structures CH penetrating the respective third conductive patterns 132 may be substantially the same.

The channel structures CH may form a plurality of channel sequences. The channel structures CH arranged in each channel sequence may be arranged in a row in the direction in which the plurality of bit lines BL extend. As shown in FIG. 4, each of the plurality of bit lines BL may be electrically connected to the channel structures CH via a drain contact plug DCP.

Figure 5:
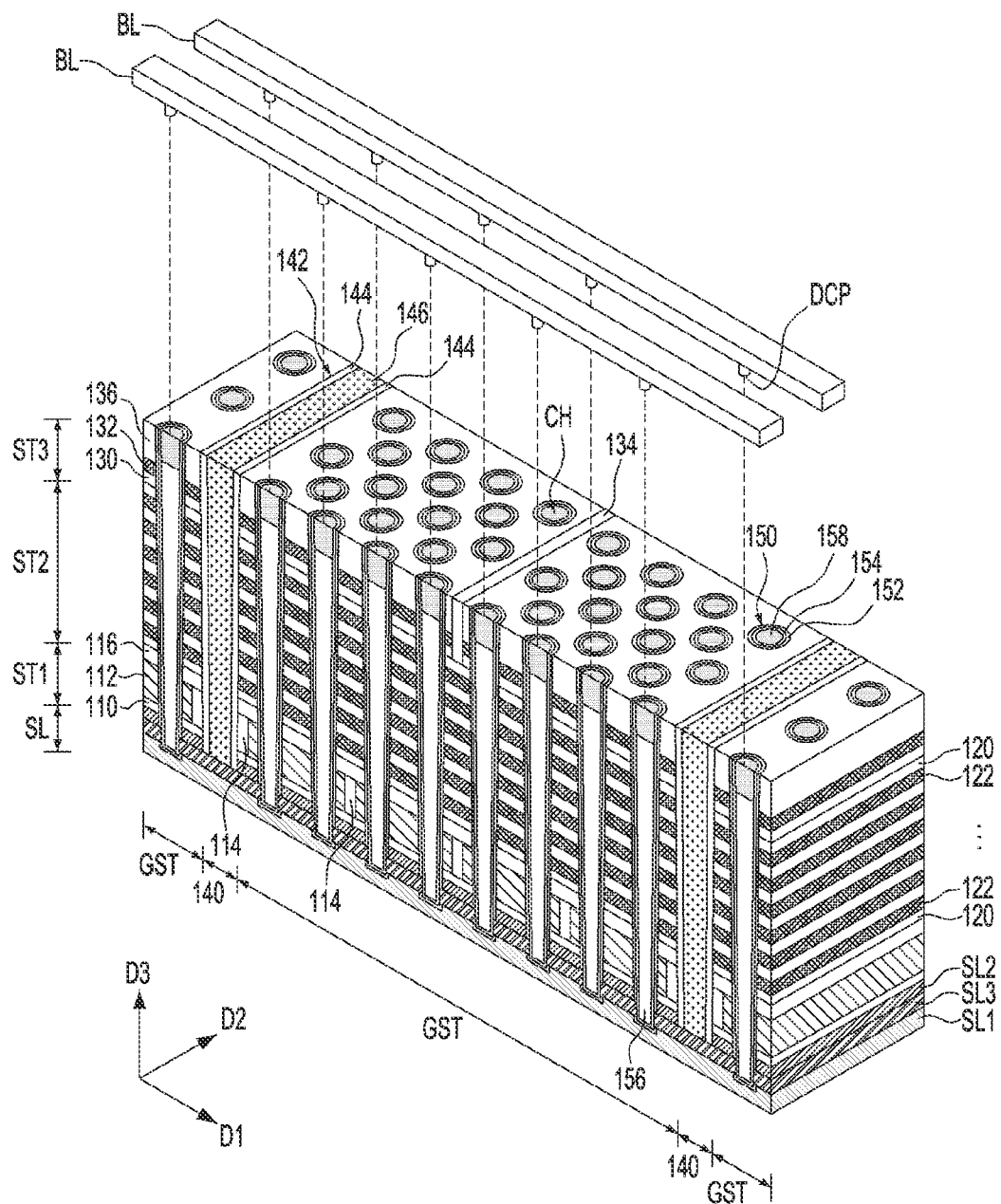
FIG. 5 to FIG. 7 are perspective views illustrating modified examples of the semiconductor memory device in accordance with an embodiment of the present disclosure.

As illustrated in FIG. 5, each of the channel structures CH penetrating the gate stack GST may include a channel hole 150 penetrating the first stack ST1, the second stack ST2, and the third stack ST3, the memory layer 152 formed along the surface of the channel hole 150, the channel layer 154 formed on the memory layer 152, a core insulating layer 156 formed on the channel layer 154 to gap-fill a part of the channel hole 150, and the capping layer 158 formed on the core insulating layer 156 to gap-fill the rest of the channel hole 150.

The channel hole 150 may penetrate the first stack ST1 to the third stack ST3, and a part thereof may have a shape extending into the source layer SL. Specifically, the channel hole 150 may penetrate the second source layer SL2 and the third source layer SL3 together with the first stack ST1 to the third stack ST3, and the bottom surface of the channel hole 150 may be located in the first source layer SL1.

The memory layer 152 formed along the surface of the channel hole 150 may include a stacked layer in which a blocking layer (not illustrated), a charge trap layer (not illustrated), and a tunnel insulating layer (not illustrated) are sequentially stacked. The tunnel insulating layer may come into contact with the channel layer 154, and the blocking layer may come into contact with the first conductive pattern 112, the second conductive pattern 122, and the third conductive pattern 132. The tunnel insulating layer and the blocking layer may each include an oxide layer and the charge trap layer may include a nitride layer.

Meanwhile, the present embodiment illustrates a case where the memory layer 152 has an ONO structure in which an oxide layer, a nitride layer, and an oxide layer are stacked; however, the present disclosure is not limited thereto. The memory layer 152 may include various material layers according to characteristics required by the semiconductor memory device, and may have various stacked structures.

The channel layer 154 may be formed on the memory layer 152 along the surface of the channel hole 150 and may have a cylindrical shape. The channel layer 154 may include an intrinsic semiconductor layer or a doped semiconductor layer such as, for example, a silicon layer or a p-type doped silicon.

The core insulating layer 156 may have a cylindrical shape, and may be formed on the channel layer 154 to partially gap-fill the channel hole 150. The channel layer 154 may have a shape surrounding the side surface and the bottom surface of the core insulating layer 156. The core insulating layer 156 may include an oxide layer.

The capping layer 158 may serve as the drain of the drain selection transistor. The capping layer 158 may be formed on the core insulating layer 156 to gap-fill the rest of the channel hole 150, and may be electrically connected to the channel layer 154. An interface between the capping layer 158 and the core insulating layer 156 may be adjacent to an interface between the third conductive pattern 132 and the second upper insulating layer 136, but may be located above the interface between the third conductive pattern 132 and the second upper insulating layer 136. The capping layer 158 may include a doped silicon layer such as, for example, an n-type doped silicon layer.

As described above, in the semiconductor memory device in accordance with the present embodiment, each of the gate stacks GST separated by the slit structures 140 includes at least three or more first conductive patterns 112, thereby substantially preventing an increase in read disturb due to an increase in the degree of integration of the semiconductor memory device so that it is possible to improve the operational reliability of the semiconductor memory device.

Figure 6:
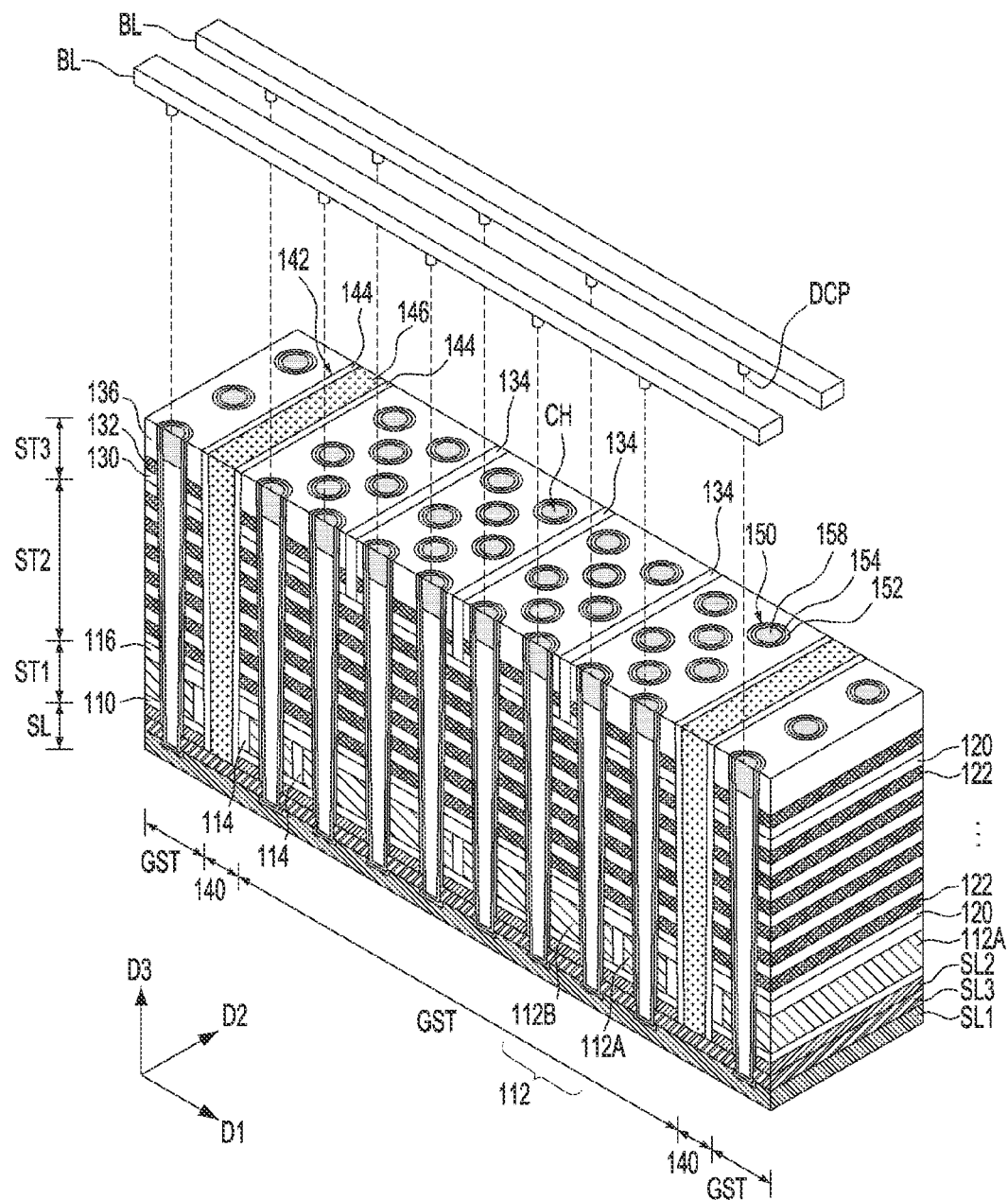

FIG. 5 to FIG. 7 are perspective views illustrating modified examples of the semiconductor memory device in accordance with an embodiment of the present disclosure.

First, FIG. 4 illustrates a case where each of the gate stacks GST separated by the slit structures 140 includes four first conductive patterns 112 located at substantially a same level and four third conductive patterns 132 located at substantially a same level. FIG. 4 illustrates a case where the first conductive patterns 112 and the third conductive patterns 132 correspond to each other in a one-to-one manner, and have substantially a same dimension. Furthermore, FIG. 4 illustrates a case where a number of the channel structures CH penetrating the first conductive patterns 112 is substantially equal to that of the channel structures CH penetrating the third conductive patterns 132.

However, the semiconductor memory device in accordance with the present embodiment is not limited to the structure illustrated in FIG. 4.

As a modified example, as illustrated in FIG. 5, each of the gate stacks GST separated by the slit structures 140 may also include four first conductive patterns 112 located at substantially a same level and two third conductive patterns 132 located at substantially a same level. In other words, in each of the gate stacks GST, the number of the third conductive patterns 132 may be smaller than that of the first conductive patterns 112, and any one of the third conductive patterns 132 may overlap two or more first conductive patterns 112. For example, two first conductive patterns 112 may correspond to any one of the third conductive pattern 132, and may have different dimensions.

As another modified example, as illustrated in FIG. 6, each of the gate stacks GST separated by the slit structures 140 may include four first conductive patterns 112 located at substantially a same level and four third conductive patterns 132 located at substantially a same level. The third conductive patterns 132 may have substantially a same shape as that illustrated in FIG. 4.

Here, the number of the channel structures CH penetrating each of the first conductive patterns 112 may be different from each other. Specifically, each of the first conductive patterns 112 may include outer patterns 112A adjacent to both edges of the first stack ST1, that is, the slit structures 140, and an inner pattern 112B located between the outer patterns 112A. In such a case, a line width and a dimension of the outer pattern 112A may be smaller than those of the inner pattern 112B so that the number of the channel structures CH penetrating the inner pattern 112B spaced father from the slit structures 140 may be larger than the number of the channel structures CH penetrating the outer pattern 112A adjacent to the slit is structures 140. Consequently, it is possible to further improve the operational reliability of the semiconductor memory device by substantially preventing deterioration in the characteristics of the cell string including the channel structure CH adjacent to the slit structure 140.

In each of the gate stacks GST, the number of the third conductive patterns 132 may be substantially equal to that of the first conductive patterns 112, and the third conductive pattern 132 adjacent to the slit structure 140 may overlap two first conductive patterns 112. That is, the third conductive pattern 132 adjacent to the slit structure 140 may overlap a part of the outer pattern 112A and the inner pattern 112B.

As another modified example, as illustrated in FIG. 7, each of the gate stacks GST separated by the slit structures 140 may include the first conductive patterns 112 having a multilayer structure and the third conductive patterns 132 having a single layer structure. The third conductive patterns 132 may have substantially a same shape as that illustrated in FIG. 4.

As illustrated in FIG. 7, the first conductive patterns 112 may include three or more first patterns 112-1 located on a lower layer, second patterns 112-2 located on an upper layer and located on both edges of the first stack ST1, and a plurality of third patterns 112-3 located on the upper layer and located between the second patterns 112-2. The upper layer and the lower layer may be electrically isolated by an interlayer dielectric layer 118. Each of the third patterns 112-3 may overlap a part of the two first patterns 112-1, and the third patterns 112-3 and the first patterns 112-1 may be disposed in a zigzag manner in the third direction D3. A line width and a dimension of each of the first patterns 112-1 may be substantially equal to those of each of the third patterns 112-3. A line width and a dimension of each of the second patterns 112-2 may be smaller than those of each of the third patterns 112-3. In each of the gate stacks GST, the number of the third conductive patterns 132 may be substantially equal to that of the first patterns 112-1. Each of the third conductive patterns 132 may overlap each of the corresponding first patterns 112-1. In each of the gate stacks GST, the third conductive pattern 132 adjacent to the slit structure 140 may overlap a part of the first pattern 112-1, the second pattern 112-2, and the third pattern 112-3 so that it is possible to further improve the operational reliability of the semiconductor memory device by substantially preventing deterioration in the characteristics of the cell string including the channel structure CH adjacent to the slit structure 140.

The channel structures CH may each include a first channel structure and a second channel structure adjacent to the first channel structure, and the first channel structure and the second channel structure may penetrate substantially the same third pattern 112-3. In such a case, the first channel structure and the second channel structure may penetrate different first patterns 112-1 so that it is possible to further improve the operational reliability of the semiconductor memory device by improving the control power of the source selection transistor for the channel structures CH.

Figure 8:
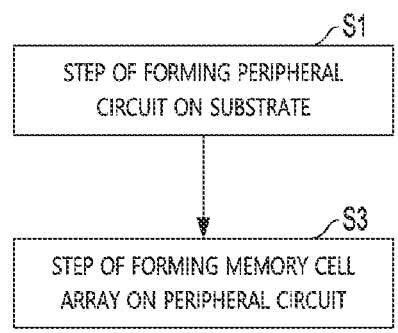
FIG. 8 is a flowchart schematically illustrating a method for fabricating the semiconductor memory device in accordance with an embodiment of the present disclosure.

FIG. 8 is a flowchart schematically illustrating a method for fabricating the semiconductor memory device in accordance with an embodiment of the present disclosure.

As illustrated in FIG. 8, the method for fabricating the semiconductor memory device may include a step S1 of forming a peripheral circuit on a substrate and a step S3 of forming a memory cell array on the peripheral circuit.

First, in step S1, the peripheral circuit may be provided on the substrate. The peripheral circuit may include a plurality of transistors, wherein respective sources and drains of the transistors may be formed in a partial region of the substrate and respective gate electrodes of the transistors may be formed on the substrate.

Subsequently, in step S3, the memory cell array may be formed on the peripheral circuit. Step S3 may include a step of forming the source layer SL illustrated in FIG. 3, a step of forming the gate stacks GST illustrated in FIG. 3, and a step of forming the bit lines BL illustrated in FIG. 3.

Although not illustrated in the drawing, conductive patterns for interconnections may be formed on the peripheral circuit before step S3, and the memory cell array may be formed on the interconnections.

Figure 9:
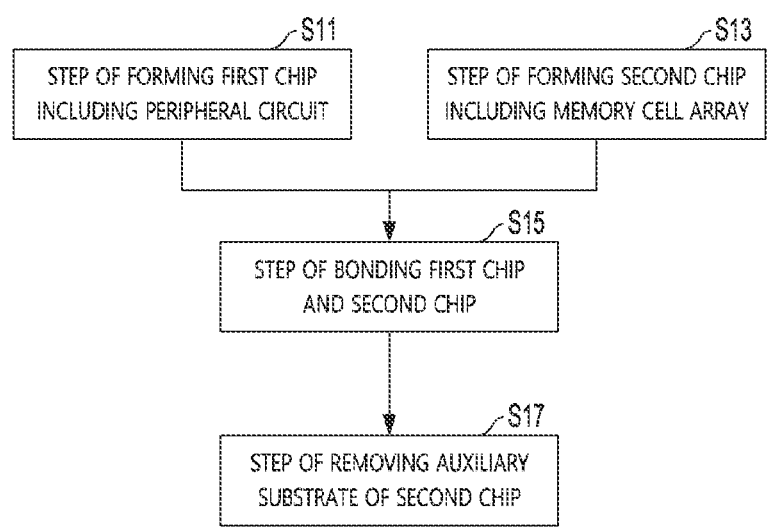
FIG. 9 is a flowchart schematically illustrating a method for fabricating the semiconductor memory device in accordance with an embodiment of the present disclosure.

FIG. 9 is a flowchart schematically illustrating a method for fabricating the semiconductor memory device in accordance with an embodiment of the present disclosure.

As illustrated in FIG. 9, the method for fabricating the semiconductor memory device may include a step S11 of forming a first chip including a peripheral circuit, a step S13 of forming a second chip including a memory cell array, a step S15 of bonding the first chip and the second chip, and a step S17 of removing an auxiliary substrate of the second chip.

First, in step S11, the peripheral circuit may be provided on a main substrate. The first chip may include first interconnections electrically connected to the peripheral circuit.

Subsequently, in step S13, the memory cell array may be formed on the auxiliary substrate. Step S13 may include a step of forming the source layer SL illustrated in FIG. 3, a step of forming the gate stacks GST illustrated in FIG. 3, and a step of forming the bit lines BL illustrated in FIG. 3. The second chip may further include second interconnections electrically connected to the memory cell array.

Meanwhile, FIG. 3 illustrates a case where the source layer SL, the gate stacks GST, and the bit lines BL are sequentially stacked in the memory cell array; however, the present disclosure is not limited thereto. As a modified example, in step S13, the memory cell array may have a structure in which the gate stacks are formed on the bit line and the source layer is not formed.

Subsequently, in step S15, the second chip may be aligned on the first chip such that the first interconnections and the second interconnections face each other, and a portion of the first interconnections and a portion of the second interconnections may be bonded to each other.

Subsequently, in step S17, the auxiliary substrate of the second chip may be removed to form the semiconductor memory device in which the peripheral circuit and the memory cell array overlap each other.

Meanwhile, as a modified example, when the memory cell array has a structure in which the gate stacks are formed on the bit line and the source layer is not formed in step S13, the source layer electrically connected to channel structures may be formed after step S17.

FIG. 10A to FIG. 10F are sectional views illustrating a method for fabricating the semiconductor memory device in accordance with an embodiment of the present disclosure. FIG. 10A to FIG. 10F are sectional views illustrating a method for fabricating the memory cell array of the semiconductor memory device, and the method for fabricating the memory cell array to be described below with reference to FIG. 10A to FIG. 10F may be included in step S3 illustrated in FIG. 8 or may be included in step S13 illustrated in FIG. 9.

Figure 10A:
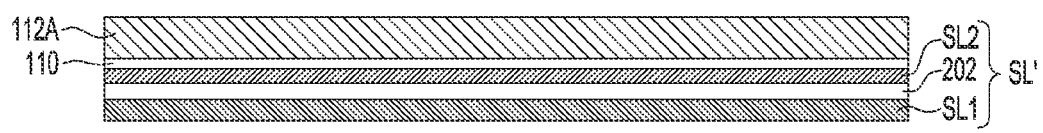
FIG. 10A to FIG. 10F are sectional views illustrating a method for fabricating the semiconductor memory device in accordance with an embodiment of the present disclosure.

As illustrated in FIG. 10A, a pre-source layer SL' is formed on a substrate (not illustrated) on which a predetermined structure has been formed. The predetermined structure may be the peripheral circuit PC of FIG. 3 and the pre-source layer SL' may be formed on the peripheral circuit PC.

The pre-source layer SL' may be formed by sequentially stacking a first source layer SL1, a sacrificial source layer 202, and a second source layer SL2. The first source layer SL1 and the second source layer SL2 may be formed of a doped semiconductor layer such as, for example, an n-type doped silicon layer. The sacrificial source layer 202 may be formed of an insulating layer, such as, for example, a nitride layer.

Next, a first lower insulating layer 110, such as, for example, an oxide layer, is formed on the pre-source layer SL'.

Next, a conductive layer 112A is formed on the first lower insulating layer 110, wherein the conductive layer 112A may be formed of a doped semiconductor layer or a metal silicide layer in order to substantially prevent the characteristics of the conductive layer 112A from deteriorating in a subsequent process, particularly, a high temperature process. Furthermore, the conductive layer 112A may be formed as a stacked layer in which the doped semiconductor layer and the metal silicide layer are stacked, wherein an n-type doped silicon layer may be used as the doped semiconductor layer and a tungsten silicide layer may be used as the metal silicide layer.

Figure 10B:
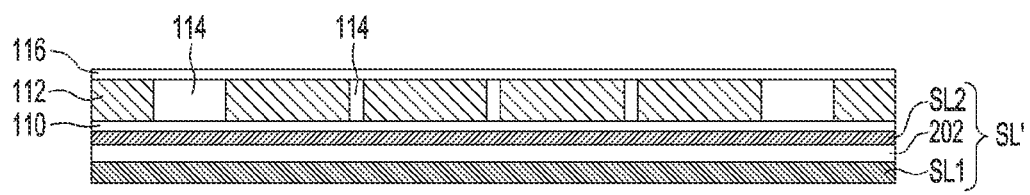

As illustrated in FIG. 10B, after a hard mask pattern (not illustrated) is formed on the conductive layer 112A, the conductive layer 112A is etched using the hard mask pattern as an etching barrier to form a plurality of first conductive patterns 112 so that the plurality of first conductive patterns 112 may be spaced apart from one another at substantially the same level.

Next, after the hard mask pattern (not illustrated) is removed, a gap-fill insulating layer 114 for gap-filling between the plurality of first conductive patterns 112 is formed, and subsequently, a first upper insulating layer 116 is formed on the plurality of first conductive patterns 112 and the gap-fill insulating layer 114. The gap-fill insulating layer 114 and the first upper insulating layer 116 may each be formed of an oxide layer, and may be formed together through a one-time oxide layer deposition process. That is, the gap-fill insulating layer 114 and the first upper insulating layer 116 may be integrally formed with each other.

Thus, a plurality of first stacks each including at least three or more first conductive patterns 112 spaced apart from one another at substantially a same level may be formed.

Figure 10C:
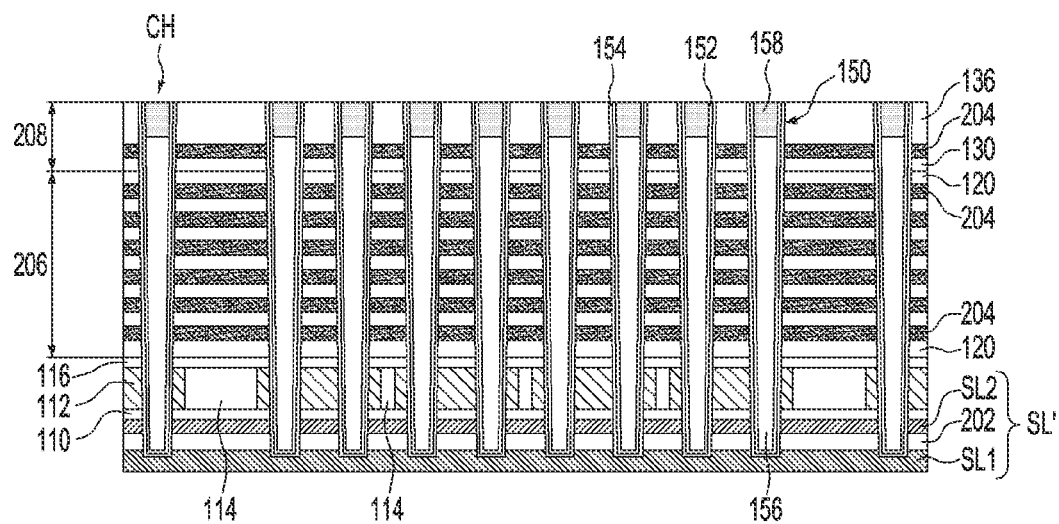

As illustrated in FIG. 10C, a first stack layer 206, in which interlayer dielectric layers 120 and sacrificial layers 204 are alternately stacked, may be formed on the first upper insulating layer 116. The interlayer dielectric layer 120 may be formed to be located on each of the lowermost layer and the uppermost layer of the first stack layer 206, wherein the interlayer dielectric layers 120 may be each formed of an oxide layer and the sacrificial layers 204 may each be formed of a nitride layer.

Meanwhile, the present embodiment illustrates a case where the interlayer dielectric layer 120 is formed on each of the lowermost layer and the uppermost layer of the first stack layer 206; however, the present disclosure is not limited thereto. As a modified example, the sacrificial layer 204 may be formed on each of the lowermost layer and the uppermost layer of the first stack layer 206.

Next, subsequent to the process of forming the first stack layer 206, a second stack layer 208, in which a second lower insulating layer 130, the sacrificial layer 204, and a second upper insulating layer 136 are sequentially stacked, is formed on the first stack layer 206. The second lower insulating layer 130 and the second upper insulating layer 136 may each formed of an oxide layer and the sacrificial layer 204 may be formed of a nitride layer. The second upper insulating layer 136 may be formed to have a larger thickness than the second lower insulating layer 130 or the interlayer dielectric layer 120.

Next, after a hard mask pattern (not illustrated) is formed on the second upper insulating layer 136, the second stack layer 208, the first stack layer 206, the first upper insulating layer 116, the first conductive patterns 112, the first lower insulating layer 110, and the pre-source layer SL' are etched using the hard mask pattern as an etching barrier to form a plurality of channel holes 150. Each of the plurality of channel holes 150 may be formed to penetrate the second stack layer 208, the first stack layer 206, the first upper insulating layer 116, the first conductive patterns 112, the first lower insulating layer 110, the second source layer SL2, and the sacrificial source layer 202. Furthermore, the end (or bottom surface) of each of the plurality of channel holes 150 may be formed is inside the first source layer SL1.

Next, after the hard mask pattern (not illustrated) is removed, a memory layer 152 having a uniform thickness is formed along the surface (that is, bottom and side surfaces) of each of the plurality of channel holes 150. The memory layer 152 may be formed as a stacked layer in which a blocking layer (not illustrated), a charge trap layer (not illustrated), and a tunnel insulating layer (not illustrated) are sequentially stacked. The tunnel insulating layer and the blocking layer may each be formed of an oxide layer and the charge trap layer may be formed of a nitride layer.

Next, a channel layer 154 having a uniform thickness is formed on the memory layer 152 along the surface of each of the plurality of channel holes 150. The channel layer 154 may be formed of a semiconductor layer such as, for example, a silicon layer.

Next, a core insulating layer 156 for gap-filling each of the plurality of channel holes 150 may be formed on the channel layer 154. The core insulating layer 156 may be formed of an oxide layer.

Next, a part of the core insulating layer 156 is recessed, and then a conductive material gap-fills the recessed space to form a capping layer 158. The core insulating layer 156 may be recessed such that an interface between the core insulating layer 156 and the capping layer 158 is adjacent to an interface between the sacrificial layer 204 and the second upper insulating layer 136, but is located above the interface between the sacrificial layer 204 and the second upper insulating layer 136. The capping layer 158 may be formed of a doped semiconductor layer such as, for example, an n-type doped silicon layer.

Thus, a plurality of channel structures CH each including the channel hole 150, the memory layer 152, the channel layer 154, the core insulating layer 156, and the capping layer 158 may be formed.

Figure 10D:
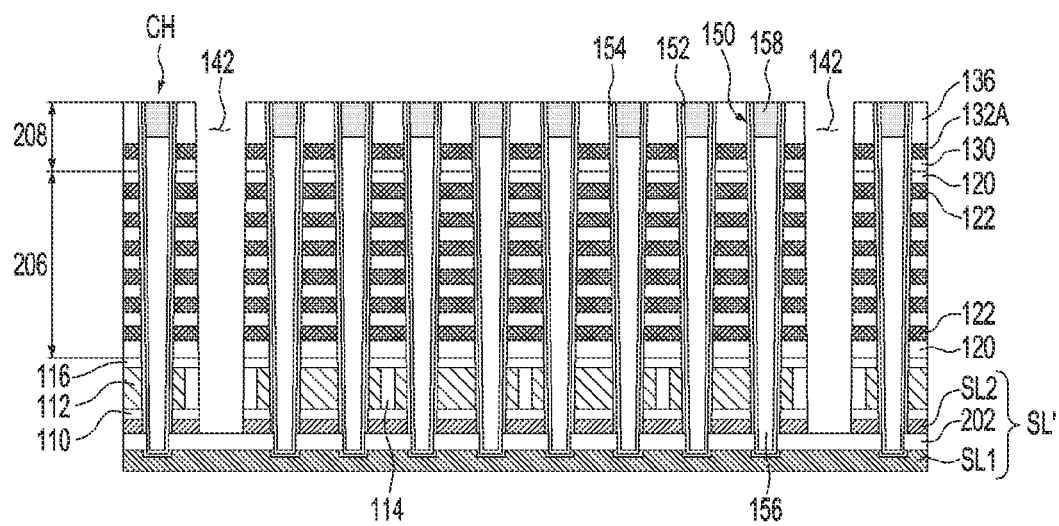

As illustrated in FIG. 10D, after a hard mask pattern (not illustrated) is formed on the second upper insulating layer 136, the second stack layer 208, the first stack layer 206, the first upper insulating layer 116, the first conductive patterns 112, the first lower insulating layer 110, and the pre-source layer SL' are etched using the hard mask pattern as an etching barrier to form a plurality of slit trenches 142. Each of the plurality of slit trenches 142 may be formed to penetrate the second stack layer 208, the first stack layer 206, the first upper insulating layer 116, the first conductive patterns 112, the first lower insulating layer 110, and the second source layer SL2. Furthermore, the end (or bottom surface) of each of the plurality of slit trenches 142 may be formed inside the sacrificial source layer 202.

Next, the sacrificial layer 204 is removed from the first stack layer 206 and the second stack layer 208 through the plurality of slit trenches 142, and then a conductive material gap-fills a space from which the sacrificial layer 204 has been removed. Thus, a plurality of second conductive patterns 122 separated by the interlayer dielectric layer 120 may be formed in the first stack layer 206. Then, a conductive layer 132A may be formed in the second stack layer 208.

Next, an etching process is performed to remove the conductive material remaining on the sidewall of each of the plurality of slit trenches 142, wherein the etching process may be performed as an etching back process.

Figure 10E:
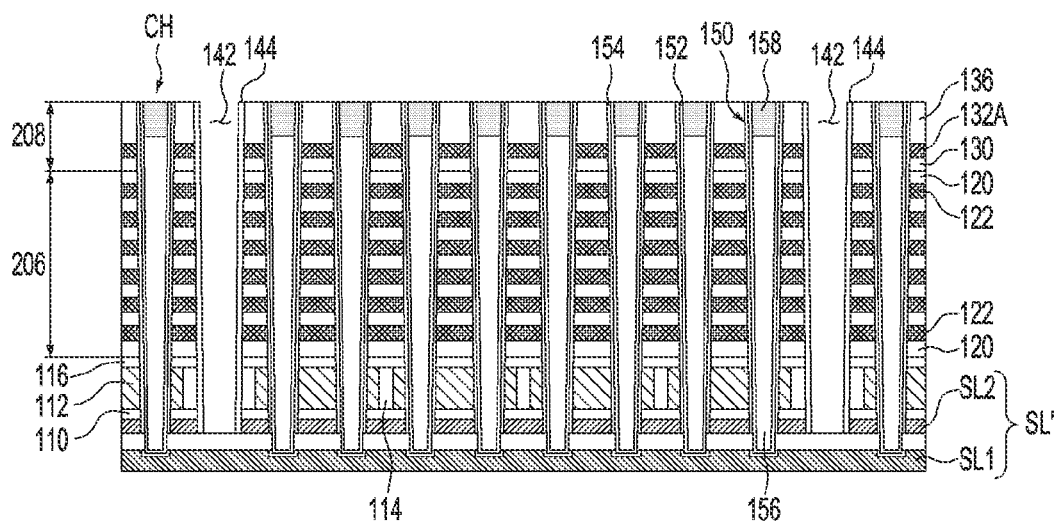

As illustrated in FIG. 10E, a slit spacer 144, for example, an insulating layer, is formed on both sidewalls of each of the plurality of slit trenches 142.

Next, the sacrificial source layer 202 is removed through the bottom surface of each of the plurality of slit trenches 142, and subsequently, the memory layer 152 exposed by removing the sacrificial source layer 202 is removed to expose the channel layer 154.

Figure 10F:
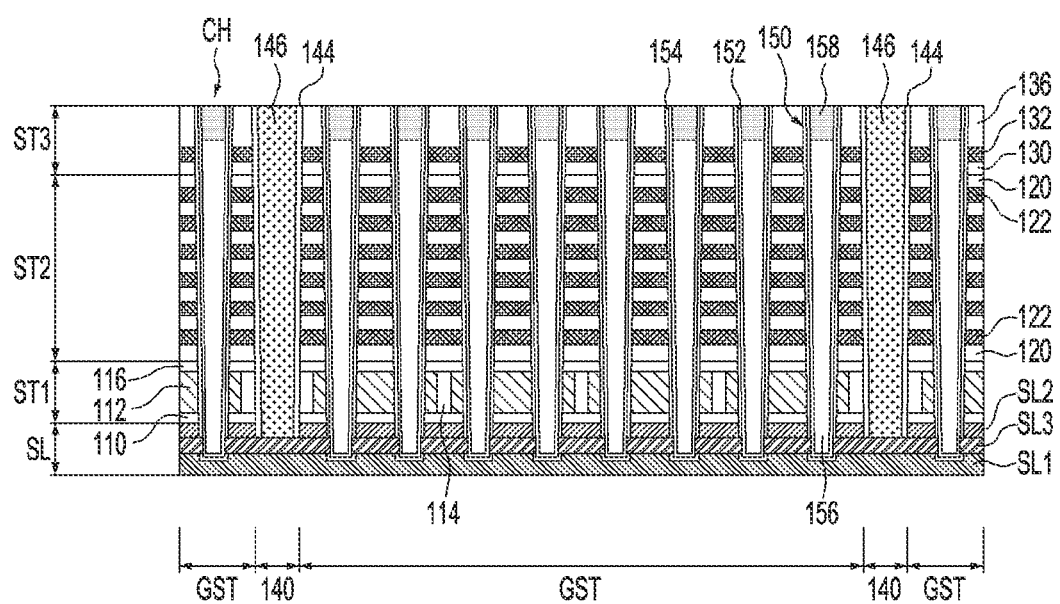

As illustrated in FIG. 10F, a conductive material gap-fills a space from which the sacrificial source layer 202 has been removed, thereby forming a third source layer SL3 electrically connected to the channel layer 154, the first source layer SL1, and the second source layer SL2. The third source layer SD may be formed of a doped semiconductor layer such as for example, an n-type doped silicon layer.

Next, a slit layer 146, for example, a conductive layer, for gap-filling the slit trench 142 is formed. Thus, a plurality of slit structures 140 each including the slit trench 142, the slit spacer 144, and the slit layer 146 may be formed.

Next, a plurality of separation layers 134 that each penetrate the second upper insulating layer 136, the conductive layer 132A, and the second lower insulating layer 130 are formed. As the separation layers 134 are formed, a plurality of third conductive patterns 132 may be formed. The third conductive patterns 132 may be formed to have the number corresponding to the number of the first conductive patterns 112.

Thus, it is possible to form the memory cell array including the gate stacks GST, the slit structures 140 each separating the gate stacks GST from each other, and the plurality of channel structures CH penetrating the gate stacks GST illustrated in FIG. 4, the gate stacks GST each including the first stack ST1 including at least three or more first conductive patterns 112 spaced apart from one another at substantially a same level, the second stack ST2 including the second conductive patterns 122 and the interlayer dielectric layers 120 alternately stacked, and the third stack ST3 including the plurality of third conductive patterns 132 separated by the separation layers 134 to have a number corresponding to the number of the first conductive patterns 112.

Then, the semiconductor memory device may be completed through the known fabricating method.

As described above, according to the method for fabricating the semiconductor memory device in accordance with an embodiment of the present disclosure, the plurality of first conductive patterns 112 spaced apart from one another at substantially a same level are formed earlier than the second conductive patterns 122, the third conductive patterns 132, the slit structures 140, and the channel structures CH, so that it is possible to improve the operational reliability of the semiconductor memory device, and simultaneously, to substantially prevent an increase in process steps, thereby securing price competitiveness. For reference, by the method for replacing the sacrificial layer with the conductive layer, it is possible to form only two first conductive patterns 112 in the gate stack GST. However, in the present embodiment, it is possible to form at least three or more first conductive patterns 112.

Furthermore, since the first conductive patterns 112 are formed of a semiconductor layer and/or a metal silicide layer, even though the first conductive patterns 112 are formed earlier than the second conductive patterns 122, the third conductive patterns 132, the slit structures 140, and the channel structures CH, it is possible to improve the operational reliability of the semiconductor memory device by substantially preventing the characteristics of the first conductive patterns 112 from deteriorating between processes.

Figure 11:
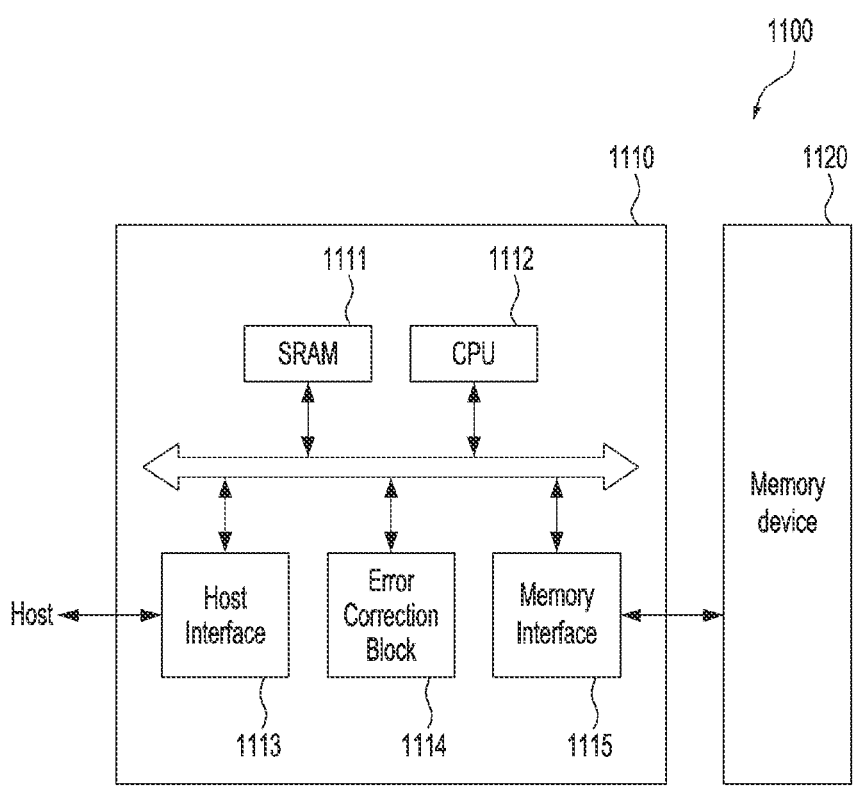
FIG. 11 is a block diagram illustrating a configuration of a memory system in accordance with an embodiment of the present disclosure.

FIG. 11 is a block diagram illustrating a configuration of a memory system 1100 in accordance with an embodiment of the present disclosure.

As illustrated in FIG. 11, the memory system 1100 includes a memory device 1120 and a memory controller 1110.

The memory device 1120 may include a plurality of gate stacks separated by a plurality of slit structures. As an example, each of the gate stacks may include a first stack including three or more first conductive patterns spaced apart from one another at substantially a same level, a second stack formed on the first stack and including second conductive patterns and interlayer dielectric layers alternately stacked, a third stack formed on the second stack and including a plurality of third conductive patterns spaced apart from one another at substantially a same level, and a plurality of channel structures penetrating the first stack to the third stack. As another example, each of the gate stacks may include a first stack having a multilayer structure and including three or more first conductive patterns spaced apart from one another for each layer, a second stack formed on the first stack and including second conductive patterns and interlayer dielectric layers alternately stacked, a third stack formed on the second stack, having a single layer structure, and including a plurality of third conductive patterns spaced apart from one another, and a plurality of channel structures penetrating the first stack to the third stack. The memory device 1120 includes at least three or more first conductive patterns in each of the gate stacks, and thus may improve operational reliability by substantially preventing an increase in read disturb due to an increase in the degree of integration of the memory device 1120.

The memory device 1120 may be a multi-chip package composed of a plurality of flash memory chips.

The memory controller 1110 is configured to control the memory device 1120, and may include a static random access memory (SRAM) 1111, a central processing unit (CPU) 1112, a host interface 1113, an error correction block 1114, and a memory interface 1115. The SRAM 1111 may be used as a working memory of the CPU 1112, the CPU 1112 may perform various control operations for data exchange of the memory controller 1110, and the host interface 1113 may include a data exchange protocol of a host electrically connected to the memory system 1100. Furthermore, the error correction block 1114 may detect and correct an error included in data read from the memory device 1120, and the memory interface 1115 may perform interfacing with the memory device 1120. In addition, the memory controller 1110 may further include a read only memory (ROM) that stores code data for interfacing with the host.

Figure 12:
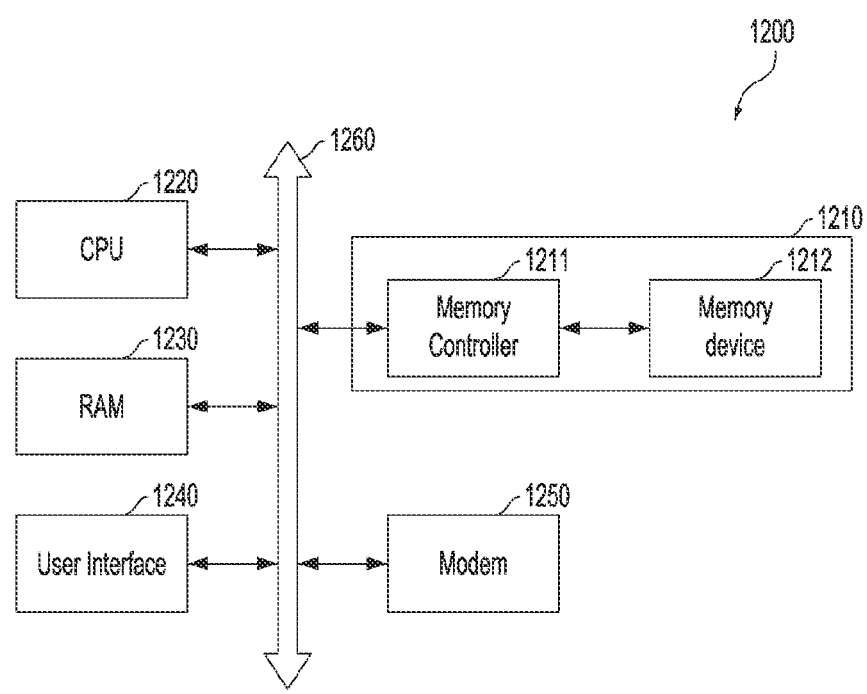
FIG. 12 is a block diagram illustrating a configuration of a computing system in accordance with an embodiment of the present disclosure.

FIG. 12 is a block diagram illustrating a configuration of a computing system 1200 in accordance with an embodiment of the present disclosure.

As illustrated in FIG. 12, the computing system 1200 may include a CPU 1220, a random access memory (RAM) 1230, a user interface 1240, a modem 1250, and a memory system 1210 which are electrically connected to a system bus 1260. The computing system 1200 may be a mobile device.

The memory system 1210 may include a memory device 1212 and a memory controller 1211. The memory device 1212 may include a plurality of gate stacks separated by a plurality of slit structures. As an example, each of the gate stacks may include a first stack including three or more first conductive patterns spaced apart from one another at substantially a same level, a second stack formed on the first stack and including second conductive patterns and interlayer dielectric layers alternately stacked, a third stack formed on the second stack and including a plurality of third conductive patterns spaced apart from one another at substantially a same level, and a plurality of channel structures penetrating the first stack to the third stack. As another example, each of the gate stacks may include a first stack having a multilayer structure and including three or more first conductive patterns spaced apart from one another for each layer, a second stack formed on the first stack and including second conductive patterns and interlayer dielectric layers alternately stacked, a third stack formed on the second stack, having a single layer structure, and including a plurality of third conductive patterns spaced apart from one another, and a plurality of channel structures penetrating the first stack to the third stack. The memory device 1212 includes at least three or more first conductive patterns in each of the gate stacks, and thus may improve operational reliability by substantially preventing an increase in read disturb due to an increase in the degree of integration of the memory device 1212.

Although the present disclosure has been described in detail with reference to a preferred embodiment, the present disclosure is not limited to the embodiment, and various modifications can be made by a person skilled in the art within the technical spirit of the present disclosure.

What is claimed is:

1. A semiconductor memory device comprising:
a plurality of gate stacks separated by a plurality of slit structures,
wherein each of the gate stacks comprises:
a first stack including three or more first conductive patterns spaced apart from one another in a horizontal direction;
a second stack formed over the first stack in a vertical direction and including second conductive patterns and interlayer dielectric layers alternately stacked;
a third stack formed over the second stack in the vertical direction and including a plurality of third conductive patterns spaced apart from one another; and
a plurality of channel structures formed in the first stack to the third stack,
wherein the first stack comprises:
a first lower insulating layer formed under the first conductive patterns;
a gap-fill insulating layer formed along a sidewall of each of the first conductive patterns to gap-fill between the first conductive patterns; and
a first upper insulating layer formed over the gap-fill insulating layer and the first conductive patterns.

2. The semiconductor memory device according to claim 1, wherein, in each of the gate stacks, the number of the third conductive patterns is equal to the number of the first conductive patterns, and each of the third conductive patterns overlaps each of the corresponding first conductive patterns.

3. The semiconductor memory device according to claim 1, wherein, in each of the gate stacks, the number of the third conductive patterns is smaller than the number of the first conductive patterns, and any one of the third conductive patterns overlaps two or more of the first conductive patterns.

4. The semiconductor memory device according to claim 1, wherein, in each of the gate stacks, the number of the third conductive patterns is substantially equal to the number of the first conductive patterns, and a third conductive pattern, which is adjacent to the slit structure among the third conductive patterns, overlaps two of the first conductive patterns.

5. The semiconductor memory device according to claim 4, wherein a first conductive pattern, which is adjacent to the slit structure among the first conductive patterns, has a smaller line width than the remaining first conductive patterns.

6. The semiconductor memory device according to claim 1, wherein a sidewall of each of the first conductive patterns located at both edges of the first stack is spaced apart from a sidewall of a facing slit structure.

7. The semiconductor memory device according to claim 1, wherein the gap-fill insulating layer and the first upper insulating layer are integrally formed with each other.

8. The semiconductor memory device according to claim 1, wherein the first conductive patterns include at least one of a doped semiconductor layer, a metal silicide layer, and a stacked layer in which the doped semiconductor layer and the metal silicide layer are stacked.

9. The semiconductor memory device according to claim 1, wherein the plurality of channel structures is configured to penetrate the first conductive patterns, and
the number of the channel structures penetrating the respective first conductive patterns is substantially the same.

10. The semiconductor memory device according to claim 1, wherein the channel structures penetrate the first conductive patterns, and the number of the channel structures penetrating a first conductive pattern, which is adjacent to the slit structure among the first conductive patterns, is smaller than the number of the channel structures penetrating the remaining first conductive patterns.

11. The semiconductor memory device according to claim 1, wherein each of the channel structures comprises:
a channel hole that penetrates the first stack to the third stack;
a memory layer formed along a surface of the channel hole;
a channel layer formed on the memory layer;
a core insulating layer formed on the channel layer to gap-fill a part of the channel hole; and
a capping layer formed on the core insulating layer to gap-fill the rest of the channel hole, and electrically connected to the channel layer.

* * * * *